US 10,366,976 B2

(12) United States Patent
Kotani et al.

(10) Patent No.: US 10,366,976 B2
(45) Date of Patent: Jul. 30, 2019

(54) SEMICONDUCTOR DEVICE

(71) Applicant: SHINDENGEN ELECTRIC MANUFACTURING CO., LTD., Chiyoda-ku (JP)

(72) Inventors: Ryohei Kotani, Hanno (JP); Toshiki Matsubara, Hanno (JP); Nobutaka Ishizuka, Hanno (JP); Masato Mikawa, Hanno (JP); Hiroshi Oshino, Hanno (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 26 days.

(21) Appl. No.: 15/738,451

(22) PCT Filed: Dec. 22, 2016

(86) PCT No.: PCT/JP2016/088450
§ 371 (c)(1),
(2) Date: Dec. 20, 2017

(87) PCT Pub. No.: WO2018/116457
PCT Pub. Date: Jun. 28, 2018

(65) Prior Publication Data
US 2019/0148354 A1 May 16, 2019

(51) Int. Cl.
H01L 29/866 (2006.01)
H01L 27/02 (2006.01)
(Continued)

(52) U.S. Cl.
CPC ...... H01L 27/0255 (2013.01); H01L 29/0688 (2013.01); H01L 29/0692 (2013.01);
(Continued)

(58) Field of Classification Search
CPC ............ H01L 27/0255; H01L 29/7808; H01L 29/866
See application file for complete search history.

(56) References Cited

U.S. PATENT DOCUMENTS 5,043,781 A  8/1991  Nishiura et al.
6,246,092 B1 6/2001 Fujihira et al.
(Continued)

FOREIGN PATENT DOCUMENTS

JP  10-321857 A  12/1998
JP  11-243200 A   9/1999
(Continued)

OTHER PUBLICATIONS

International Search Report dated Mar. 14, 2017 in PCT/JP2016/088450 filed Dec. 22, 2016 (with English translation of categories of cited documents).
(Continued)

Primary Examiner — Thomas L Dickey
(74) Attorney, Agent, or Firm — Oblon, McClelland, Maier & Neustadt, L.L.P.

(57) ABSTRACT

A semiconductor switch SW that includes a collector electrode C, an emitter electrode E and a gate electrode G, a Zener diode 5A configured to include one end electrically connected to the collector electrode C, the other end electrically connected to the gate electrode G, and n-type semiconductor layers and p-type semiconductor layers alternately arranged adjacent to each other, a Zener diode 5B configured to include one end electrically connected to the gate electrode G, the other end electrically connected to the emitter electrode E, and n-type semiconductor layers and p-type semiconductor layers alternately arranged adjacent to each other, are provided. The Zener diode 5A and the Zener diode 5B are configured so as not to allow the voltage of the gate electrode G to be increased to an on-threshold voltage (Continued)

of the semiconductor switch SW in the reverse bias application state.

16 Claims, 12 Drawing Sheets

(51) Int. Cl.
*H01L 29/06* (2006.01)
*H03K 17/081* (2006.01)
*H01L 29/739* (2006.01)
*H01L 29/36* (2006.01)

(52) U.S. Cl.
CPC .......... *H01L 29/36* (2013.01); *H01L 29/7395* (2013.01); *H01L 29/866* (2013.01); *H03K 17/08116* (2013.01)

(56) References Cited

U.S. PATENT DOCUMENTS

| 6,286,491 | B1 | 9/2001 | Fukatsu et al. |
| 2001/0009287 | A1 | 7/2001 | Fujihira et al. |
| 2008/0173935 | A1 | 7/2008 | Miyajima |
| 2011/0095303 | A1 | 4/2011 | Miyajima |
| 2012/0049187 | A1 | 3/2012 | Haruyama et al. |

FOREIGN PATENT DOCUMENTS

| JP | 2000-130300 A | 5/2000 |
| JP | 2007-165424 A | 6/2007 |
| JP | 2008-177328 A | 7/2008 |
| JP | 2009-111304 A | 5/2009 |

OTHER PUBLICATIONS

Netherlands Office Action dated Jun. 15, 2018 in Netherlands Patent Application No. 2020058, 9 pages.

SEMICONDUCTOR DEVICE

TECHNICAL FIELD

The present invention relates to a semiconductor device and, more specifically, to a semiconductor device that includes a semiconductor switch and a Zener diode.

BACKGROUND ART

Conventionally, semiconductor devices have been known that include a semiconductor switch including what is called a MOS (Metal-Oxide-Semiconductor) structure. Such a semiconductor device may include a Zener diode for overvoltage protection in some cases. The Zener diode is configured to include an n-type semiconductor layer and a p-type semiconductor layer arranged adjacent to each other.

For example, in a case where the semiconductor switch is an insulated gate bipolar transistor (Insulated Gate Bipolar Transistor: IGBT), a first Zener diode is provided between a collector electrode and a gate electrode, and a second Zener diode is provided between the gate electrode and an emitter electrode. The first Zener diode and the second Zener diode are connected in series to each other.

CITATION LIST

Patent Literature

Patent Literature 1: Japanese Patent Laid-Open No. 2009-111304

SUMMARY OF INVENTION

Technical Problem

As described above, the semiconductor device that includes the first and second Zener diodes for overvoltage protection is required so that the semiconductor switch is not turned on in a reverse bias application state in order to achieve a desired breakdown voltage. Here, the "reverse bias application state" is a state where a first main electrode of the semiconductor switch is connected to a high potential, a second main electrode is connected to a low potential, and an off signal is input into a control electrode. In the case where the semiconductor switch is an IGBT, the first main electrode is the collector electrode, the second main electrode is the emitter electrode, and the control electrode is the gate electrode. The off signal has a voltage less than an on-threshold voltage.

However, in the reverse bias application state, the high voltage applied between the first main electrode and the second main electrode allows a leak current to flow through the first Zener diode and second Zener diode arranged in series. The leak current divides the high voltage applied between the first main electrode and the second main electrode, thereby unintentionally causing the voltage of the control electrode to become the on-threshold voltage or higher. As a result, there is a possibility that the semiconductor switch is turned on.

The present invention has been made on the basis of the technical recognition described above, and has an object to provide a semiconductor device that can prevent the semiconductor switch from being turned on in the reverse bias application state.

Solution to Problem

A semiconductor device according to the present invention, includes:

a semiconductor switch that includes a first main electrode connected to a high potential, a second main electrode connected to a low potential, and a control electrode;

a first Zener diode configured to include one end electrically connected to the first main electrode, another end electrically connected to the control electrode, and n-type semiconductor layers and p-type semiconductor layers alternately arranged adjacent to each other; and a second Zener diode configured to include one end electrically connected to the control electrode, and another end electrically connected to the second main electrode, and n-type semiconductor layers and p-type semiconductor layers alternately arranged adjacent to each other, the first Zener diode and the second Zener diode being configured so as not to allow a voltage of the control electrode to be increased to an on-threshold voltage of the semiconductor switch in a reverse bias application state where the first main electrode is connected to the high potential, the second main electrode is connected to the low potential, and an off signal of the semiconductor switch is input into the control electrode.

In the semiconductor device, junction areas between the n-type semiconductor layers and the p-type semiconductor layers included in the first Zener diode may be smaller than junction areas between the n-type semiconductor layers and the p-type semiconductor layers included in the second Zener diode.

In the semiconductor device, widths of the n-type semiconductor layers and the p-type semiconductor layers included in the first Zener diode may be smaller than widths of the n-type semiconductor layers and the p-type semiconductor layers included in the second Zener diode.

In the semiconductor device, thicknesses of the n-type semiconductor layers and the p-type semiconductor layers included in the first Zener diode may be smaller than thicknesses of the n-type semiconductor layers and the p-type semiconductor layers included in the second Zener diode.

The semiconductor device may further include an integrated resistor connected in parallel to the second Zener diode and integrally formed together with the second Zener diode.

In the semiconductor device, the n-type semiconductor layers each interposed between the p-type semiconductor layers among the n-type semiconductor layers included in the second Zener diode may be not formed over an entire width of the second Zener diode, and the p-type semiconductor layers adjacent in a length direction of the second Zener diode are connected to each other.

In the semiconductor device, the p-type semiconductor layers included in the second Zener diode may be meanderingly formed in a plan view.

In the semiconductor device, the n-type semiconductor layers each interposed between the p-type semiconductor layers may have distal ends rounded to have arc shapes in a plan view.

In the semiconductor device, a connecting region of the adjacent p-type semiconductor layers may be provided with a p-type semiconductor layer having a lower resistance than the p-type semiconductor layer has.

In the semiconductor device, the p-type semiconductor layer having the lower resistance may be formed so as to surround a distal end of the n-type semiconductor layer.

In the semiconductor device, the p-type semiconductor layer having the lower resistance may be provided outside of a depletion layer formed at a p-n junction between the n-type semiconductor layer and the p-type semiconductor layer included in the second Zener diode.

In the semiconductor device, at opposite ends of the second Zener diode in a width direction, the p-type semiconductor layers adjacent in the length direction of the second Zener diode may be connected to each other.

In the semiconductor device, in view of the second Zener diode in the length direction thereof, the numbers of n-type semiconductor layers may be different from each other with respect to a width direction of the second Zener diode.

In the semiconductor device, in view of the second Zener diode in the length direction thereof, the numbers of n-type semiconductor layers may be identical to each other with respect to a width direction of the second Zener diode.

In the semiconductor device, the n-type semiconductor layers included in the second Zener diode may be configured as semiconductor layers into which n-type impurities have been implanted, but are not formed over entire thicknesses of the semiconductor layers.

In the semiconductor device, wherein a p-type impurity concentration of the p-type semiconductor layers included in the first Zener diode may be lower than an n-type impurity concentration of the n-type semiconductor layers included in the first Zener diode, and a p-type impurity concentration of the p-type semiconductor layers included in the second Zener diode may be lower than an n-type impurity concentration of the n-type semiconductor layers included in the second Zener diode, and a current amplification rate of a first npn-type bipolar transistor that includes consecutive n-type semiconductor layers, p-type semiconductor layers and n-type semiconductor layers included in the first Zener diode may be lower than a current amplification rate of a second npn-type bipolar transistor that includes consecutive n-type semiconductor layers, p-type semiconductor layers and n-type semiconductor layers included in the second Zener diode.

In the semiconductor device, the p-type semiconductor layer of the first npn-type bipolar transistor may be longer than the p-type semiconductor layer of the second npn-type bipolar transistor.

In the semiconductor device, the impurity concentration of the p-type semiconductor layer of the first npn-type bipolar transistor may be higher than the impurity concentration of the p-type semiconductor layer of the second npn-type bipolar transistor.

Advantageous Effects of Invention

The present invention thus causes the voltage of the control electrode in the reverse bias application state not to reach the on-threshold voltage, thereby allowing the semiconductor switch to be prevented from being turned on in the reverse bias application state.

DESCRIPTION OF EMBODIMENTS

Embodiments of the present invention are hereinafter described with reference to the drawings. In each diagram, configuration elements having analogous functions are assigned the same signs.

First Embodiment

Referring to FIGS. 1 to 4, a semiconductor device according to a first embodiment of the present invention is described.

Figure 1:
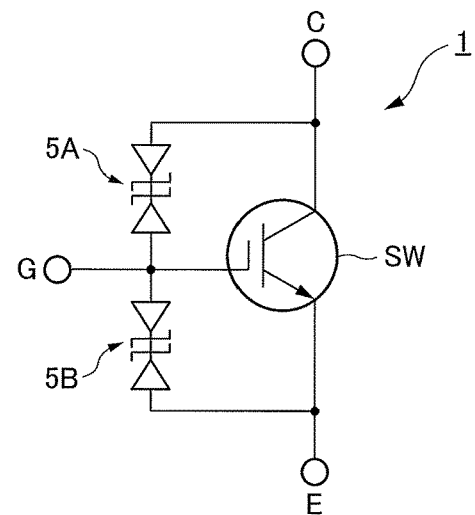
FIG. 1 is a schematic configuration diagram of a semiconductor device according to a first embodiment of the present invention.

As shown in FIG. 1, the semiconductor device 1 according to the first embodiment includes a semiconductor switch SW, a Zener diode 5A (first Zener diode), and a Zener diode 5B (second Zener diode).

The semiconductor switch SW includes a first main electrode connected to a high potential, a second main electrode connected to a low potential, and a control electrode. The semiconductor switch SW has a MOS structure, and is an insulated gate bipolar transistor (IGBT) in this embodiment. The first main electrode is a collector electrode C, the second main electrode is an emitter electrode E, and the control electrode is a gate electrode G. The collector electrode C is connected to the high potential (e.g., 400 V), and the emitter electrode E is connected to the low potential (e.g., the ground). The gate electrode G is connected to a controller (not shown) made up of a microprocessor or the like.

The semiconductor switch SW is not necessarily the IGBT, and may be another semiconductor switch that has a MOS structure. For example, the semiconductor switch SW may be a MOS field effect transistor (MOS Field Effect Transistor: MOSFET). In a case where the semiconductor switch SW is an n-type MOSFET, the first main electrode connected to the high potential is the drain electrode, and the second main electrode connected to the low potential is the source electrode.

The Zener diode 5A and the Zener diode 5B are connected in series to each other, as shown in FIG. 1. The Zener diodes 5A and 5B are multiple Zener diode elements connected in series to each other in an inverse direction, and function as overvoltage protection diodes. As shown in FIG. 1, one end of the Zener diode 5A is electrically connected to the collector electrode C, and the other end is electrically connected to the gate electrode G. One end of the Zener diode 5B is electrically connected to the gate electrode G, and the other end is electrically connected to the emitter electrode E.

In the reverse bias application state, the current flowing into the semiconductor switch SW in the off state is sufficiently low. Consequently, the leak current flowing through the Zener diode 5A is substantially identical to the leak current flowing through the Zener diode 5B.

Next, the specific configuration of the semiconductor device 1 is described. In the semiconductor device 1, the principal current flows between the conductive upper surface and lower surface of a semiconductor substrate 2. Note that the semiconductor substrate 2 is, for example, a silicon substrate. Alternatively, another semiconductor substrate (an SiC substrate, a GaN substrate, etc.) may be adopted. The conductive type of the semiconductor substrate 2 is an n-type in this embodiment. However, the type is not limited to this type.

Figure 2:
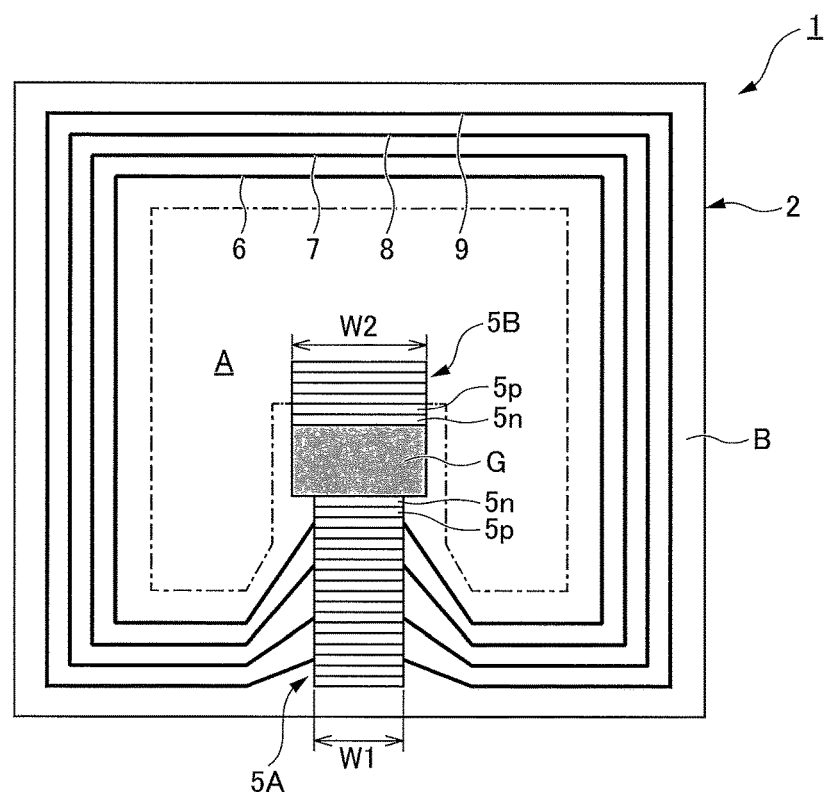
FIG. 2 is a plan view of the semiconductor device 1 according to the first embodiment.

As shown in FIG. 2, on the upper surface of the semiconductor substrate 2, an active region A through which the principal current flows, and a voltage supporting region B that surrounds the active region A are provided. The voltage supporting region B includes a peripheral portion of the semiconductor substrate 2. Here, the "peripheral portion" is a peripheral part of the semiconductor substrate 2 that includes the side surface of the semiconductor substrate 2. On the upper surface side of the semiconductor substrate 2, besides the gate electrode G, the emitter electrode E (not shown) where the active region A is formed is provided. Furthermore, on the lower surface side of the semiconductor substrate 2, the collector electrode C (not shown) is provided.

As shown in FIG. 2, the Zener diodes 5A and 5B are arranged on the upper surface of the semiconductor substrate 2. In this embodiment, the width "W1" of the Zener diode 5A is smaller than the width "W2" of the Zener diode 5B. Note that the positions at which the Zener diodes 5A and 5B are arranged are not limited to the positions shown in FIG. 2.

As shown in FIG. 2, in the voltage supporting region B of the semiconductor substrate 2, conductor portions 6, 7, 8 and 9 are provided in order to stabilize the breakdown voltage characteristics of IGBT. The conductor portions 6, 7, 8 and 9 are made of, for example, polysilicon or conductive material, such as aluminum. The conductor portions 6, 7, 8 and 9 are formed so as to surround the active region A along the voltage supporting region B, and are electrically connected to respective predetermined sites on the Zener diode 5A. Note that the semiconductor layers that are the connection destinations of the conductor portions 6, 7, 8 and 9 are semiconductor layers of the same conductive types as the conductor portions. Further note that the number of conductor portions is not limited to four. Any number of conductor portions may be adopted.

Figure 3:
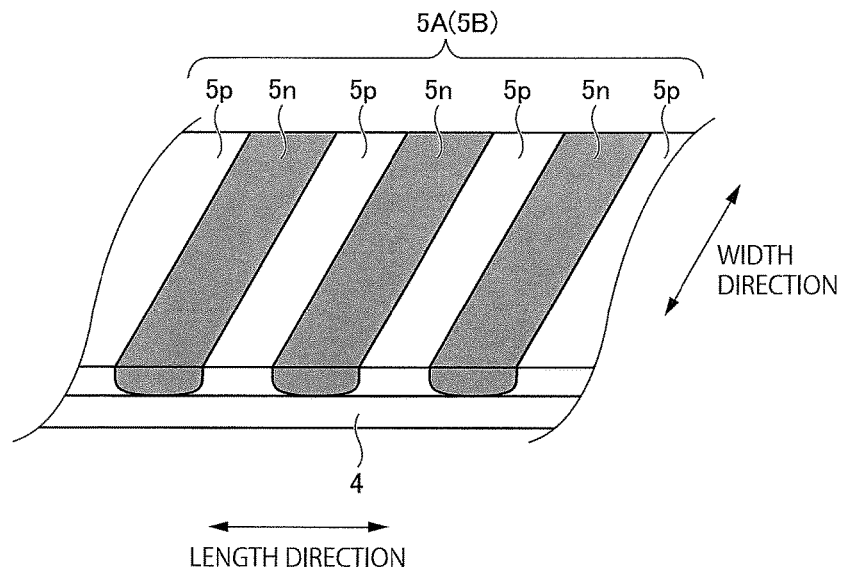
FIG. 3 is a partial sectional view of a Zener diode 5A (5B).

Next, the specific configuration of the Zener diode 5A (5B) is described. As shown in FIG. 3, the Zener diode 5A is configured such that n-type semiconductor layers 5n and p-type semiconductor layers 5p are alternately arranged along the length direction. The Zener diode 5B is configured in an analogous manner. However, the Zener diode 5B has a required breakdown voltage lower than the Zener diode 5A has. Consequently, the number of semiconductor layers included in the Zener diode 5B is smaller than that in the Zener diode 5A.

As shown in FIG. 3, the n-type semiconductor layers 5n and the p-type semiconductor layers 5p are arranged on an insulating film 4. This insulating film 4 is formed on the upper surface of the semiconductor substrate 2. For example, the insulating film 4 is silicon dioxide film ($SiO_2$ film) and, more specifically, field oxide film. The thickness of the insulating film 4 is, for example, 200 to 2000 nm.

For example, the Zener diodes 5A and 5B are formed as follows. First, a polysilicon layer is formed on the insulating film 4. The thickness of the polysilicon layer is, for example, 100 to 1000 nm. Next, p-type impurities (boron or the like) are implanted into the formed polysilicon layer to form a p-type semiconductor region. The p-type impurity concentration of the p-type semiconductor layer 5p is, for example, $1 \times 10^{17}$ cm$^{-3}$ to $1 \times 10^{19}$ cm$^{-3}$. Subsequently, using a selective ion implantation method or the like, n-type impurities (phosphorus or the like) are implanted only into a predetermined region in the p-type semiconductor region to form the n-type semiconductor layer 5n. The region in the p-type semiconductor region where the n-type semiconductor layer 5n has not been formed becomes the p-type semiconductor layer 5p.

Note that, the n-type impurity concentration of the n-type semiconductor layer 5n is, for example, $1 \times 10^{19}$ cm$^{-3}$ to $1 \times 10^{21}$ cm$^{-3}$. Thus, the p-type impurity concentrations in the p-type semiconductor layers 5p in the Zener diodes 5A and 5B are lower than the n-type impurity concentrations in the n-type semiconductor layer 5n.

The Zener diodes 5A and 5B are configured so that the voltage of the gate electrode G cannot increase to the on-threshold voltage of the semiconductor switch SW in the reverse bias application state. More specifically, in the first embodiment, the junction areas of the n-type semiconductor layers 5n and the p-type semiconductor layers 5p that constitute the Zener diode 5A are smaller than the junction areas of the n-type semiconductor layers 5n and the p-type semiconductor layers 5p that constitute the Zener diode 5B. Thus, the leak current flowing through the Zener diode 5A in the reverse bias application state is reduced. The reduction in the leak current of the Zener diode 5A, in turn, reduces the leak current of the Zener diode 5B, thereby suppressing the voltage drop in the Zener diode 5B. That is, the increase in the voltage of the control electrode of the semiconductor switch SW is suppressed.

Figure 4:
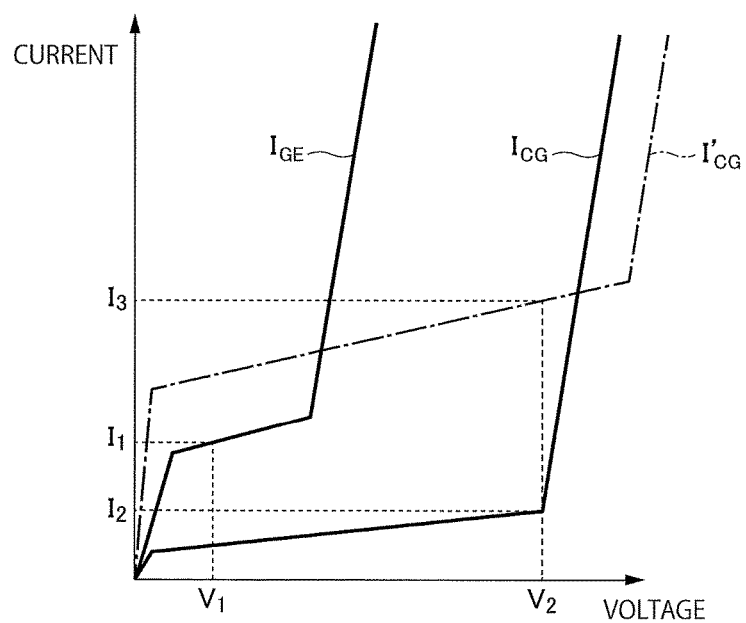
FIG. 4 is a diagram showing the current-voltage characteristics of the semiconductor switch of the semiconductor device according to the first embodiment.

Here, the suppression of increase in the voltage of the control electrode is described with reference to FIG. 4. In FIG. 4, the voltage in the abscissa axis indicates a voltage $V_{GE}$ applied to the Zener diode 5B between the gate electrode G and the emitter electrode E (hereinafter simply called "between the gate and emitter") or a voltage $V_{CG}$ applied to the Zener diode 5A between the collector and gate. The current in the ordinate axis indicates a current $I_{GE}$ through the Zener diode 5B between the gate and emitter, or a current $I_{CG}$ flowing through the Zener diode 5A between the collector and gate. A current "$I_{CG}$'" is a current flowing through the Zener diode between the collector and gate in a conventional configuration (i.e., the junction area of the Zener diode between the collector and gate is the same as that of the Zener diode between the gate and emitter). A voltage "$V_1$" is a voltage when the semiconductor switch SW is turned on. A current "$I_1$" is a current between the gate and emitter corresponding to the voltage "$V_1$". A voltage "$V_2$" is a desired breakdown voltage (e.g., 400 V) of the semiconductor device 1. A current "$I_2$" is a current between the collector and gate corresponding to the voltage "$V_2$".

As shown in FIG. 4, in the conventional configuration, in the reverse bias application state, a current "$I_3$" corresponding to the voltage $V_2$ is higher than the current "$I_1$". As described above, in the reverse bias application state, the leak current flowing through the Zener diode 5A is substantially identical to the leak current flowing through the Zener diode 5B. Consequently, the voltage between the gate and emitter is at least the on-threshold voltage of the semiconductor switch SW, which unfortunately turns on the semiconductor switch SW.

On the contrary, in the case of this embodiment, in the reverse bias application state, the current "$I_{CG}$" flowing through the Zener diode 5A becomes lower than the current "$I_{CG}$'" in the case of the conventional configuration. Consequently, as shown in FIG. 4, the current "$I_2$" corresponding to the voltage "$V_2$" is lower than the current $I_1$. That is, the leak current flowing through the Zener diode 5A when a desired breakdown voltage is applied between the collector and emitter (the current is the same as the leak current flowing through the Zener diode 5B) is lower than the leak current flowing through the Zener diode 5B when the voltage of the gate electrode reaches the on-threshold voltage.

Consequently, in the reverse bias application state, the voltage between the gate and emitter is less than the on-threshold voltage of the semiconductor switch SW, and the semiconductor switch SW is not turned on. Thus, according to the first embodiment, the semiconductor switch SW can be prevented from being erroneously turned on in the reverse bias application state.

Methods of adjusting the junction areas of the Zener diodes 5A and 5B include a method of adjusting the width of the semiconductor layer, and a method of adjusting the thickness of the semiconductor layer. Here, "the width of the semiconductor layer" is the length in a direction (i.e., the "width direction" in FIG. 3) orthogonal to the adjacent arrangement direction of the n-type semiconductor layers and p-type semiconductor layers (i.e., the "length direction" in FIG. 3).

For adjustment of the width of the semiconductor layer, the width of the n-type semiconductor layers 5n and the p-type semiconductor layers 5p that constitute the Zener diode 5A are configured to be smaller than the width of the n-type semiconductor layers 5n and the p-type semiconductor layers 5p that constitute the Zener diode 5B. In this embodiment, as shown in FIG. 2, the width "W1" of the Zener diode 5A is smaller than the width "W2" of the Zener diode 5B.

For adjustment of the thickness of the semiconductor layer, the thickness of the n-type semiconductor layers 5n and the p-type semiconductor layers 5p that constitute the Zener diode 5A is configured to be smaller than the thickness of the n-type semiconductor layers 5n and the p-type semiconductor layers 5p that constitute the Zener diode 5B.

As described above, in the first embodiment, the junction areas of the n-type semiconductor layers 5n and the p-type semiconductor layers 5p that constitute the Zener diode 5A are smaller than the junction areas of the n-type semiconductor layers 5n and the p-type semiconductor layers 5p that constitute the Zener diode 5B. This configuration reduces the leak current of the Zener diode 5A, and suppresses the voltage drop of the Zener diode 5B.

Consequently, according to the first embodiment, the semiconductor switch SW can be prevented from being erroneously turned on in the reverse bias application state.

Second Embodiment

Figure 5:
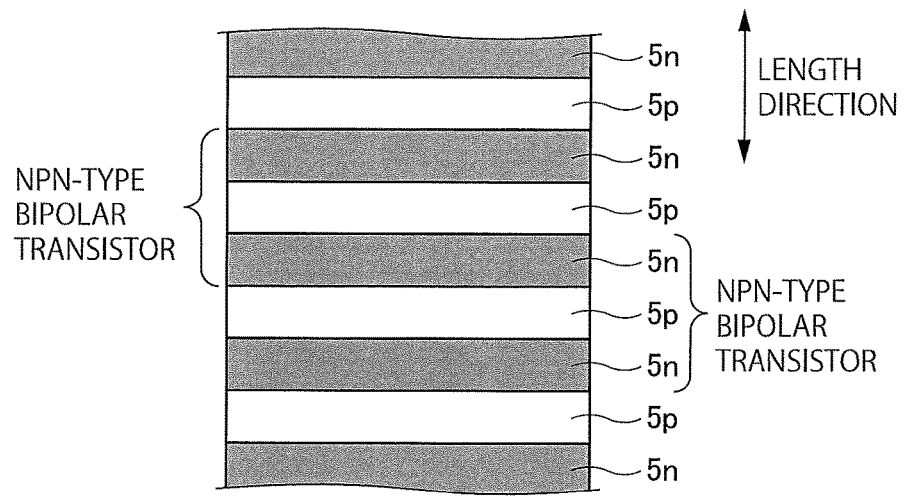
FIG. 5 is a plan view of a Zener diode of a semiconductor device according to a second embodiment.

Next, referring to FIG. 5, a semiconductor device according to a second embodiment of the present invention is described. The second embodiment assumes the Zener diode 5B between the gate and emitter as an npn-type bipolar transistor, and increases the current amplification rate of the transistor, thereby increasing the leak current between the gate and emitter and suppressing the increase in the gate voltage. The second embodiment is hereinafter described mainly on differences from the first embodiment.

As with the semiconductor device 1 of the first embodiment, the semiconductor device according to the second embodiment includes a semiconductor switch SW, a Zener diode 5A, and a Zener diode 5B.

As described above, the p-type impurity concentration in the p-type semiconductor layers 5p included in the Zener diodes 5A and 5B is lower than the n-type impurity concentration in the n-type semiconductor layers 5n. Consequently, as shown in FIG. 5, the consecutive n-type semiconductor layer 5n, p-type semiconductor layers 5p and n-type semiconductor layer 5n can be regarded to constitute the NPN transistor.

In the second embodiment, the current amplification rate ("hFE") of the first npn-type bipolar transistor that includes the consecutive n-type semiconductor layer 5n, p-type semiconductor layers 5p and n-type semiconductor layer 5n that constitute the Zener diode 5A is lower than the current amplification rate of the second npn-type bipolar transistor that includes the consecutive n-type semiconductor layer 5n, p-type semiconductor layers 5p and n-type semiconductor layer 5n that constitute the Zener diode 5B. Thus, the Zener diode 5B has a low resistance, thereby suppressing the voltage drop of the Zener diode 5B (i.e., increase in gate voltage). As a result, in the reverse bias application state, the voltage between the gate and emitter is less than the on-threshold voltage of the semiconductor switch SW, which can prevent the semiconductor switch SW from being turned on.

Methods of adjusting the current amplification rate of the npn-type bipolar transistor include a method of adjusting the length of the p-type semiconductor layer 5p that serves as a base region, and a method of adjusting the p-type impurity concentration of the p-type semiconductor layer 5p.

In the case of adjusting the length of the p-type semiconductor layer 5p, the p-type semiconductor layer 5p of the first npn-type bipolar transistor is configured to be longer than the p-type semiconductor layer 5p of the second npn-type bipolar transistor. Note that "the length of the p-type semiconductor layer 5p" is the length of each of the Zener diodes 5A and 5B in the length direction.

In the case of adjusting the p-type impurity concentration of the p-type semiconductor layer 5p, the impurity concentration of the p-type semiconductor layer 5p of the first npn-type bipolar transistor is configured to be higher than the impurity concentration of the p-type semiconductor layer 5p of the second npn-type bipolar transistor.

As described above, in the second embodiment, the resistance of the Zener diode 5B is reduced, thereby suppressing the increase in gate voltage. Consequently, according to the second embodiment, the semiconductor switch SW can be prevented from being erroneously turned on in the reverse bias application state.

Third Embodiment

Next, referring to FIGS. 6 to 15, a semiconductor device according to a third embodiment of the present invention is described. In the third embodiment, an integrated resistor connected in parallel to the Zener diode 5B is provided, thereby increasing the leak current between the gate and emitter and suppressing the increase in gate voltage.

Figure 6:
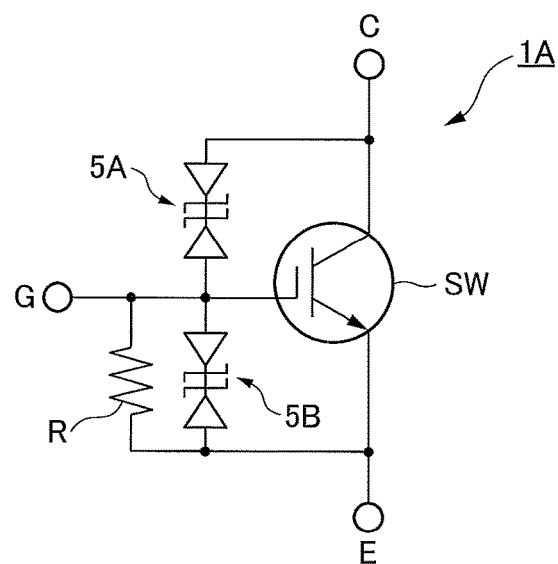
FIG. 6 is a schematic configuration diagram of a semiconductor device according to a third embodiment of the present invention.

As shown in FIG. 6, the semiconductor device 1A according to the third embodiment includes a semiconductor switch SW, a Zener diode 5A, a Zener diode 5B, and an integrated resistor R connected in parallel to the Zener diode 5B. As described later, the integrated resistor R is connected in parallel to the Zener diode 5B, and is formed together with the Zener diode 5B in an integrated manner (integrally formed). In other words, the integrated resistor R is not an externally attached resistor.

In this embodiment, the n-type semiconductor layer 5n interposed between the p-type semiconductor layers 5p among the n-type semiconductor layers 5n included in the Zener diode 5B is not formed over the entire width of the Zener diode 5B. Furthermore, the p-type semiconductor layers 5p adjacent to each other in the length direction of the Zener diode 5B are connected to each other. Thus, the p-type semiconductor layers 5p, which have a higher resistance than the n-type semiconductor layers 5n have, form the integrated resistor R in a distributed manner. Description is hereinafter made with reference to multiple specific examples.

Figure 7:
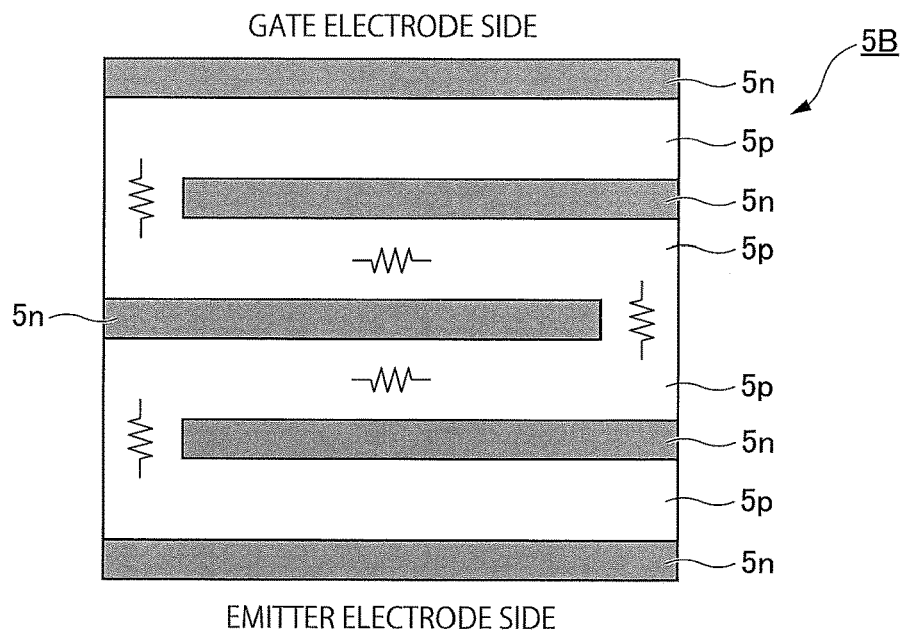
FIG. 7 is a plan view of a Zener diode 5B of a first example of the semiconductor device according to the third embodiment.

In the example shown in FIG. 7, the p-type semiconductor layers 5p included in the Zener diode 5B are meanderingly formed in a plan view. Thus, both the characteristics of the Zener diode and the resistance characteristics can be achieved.

Figure 8:
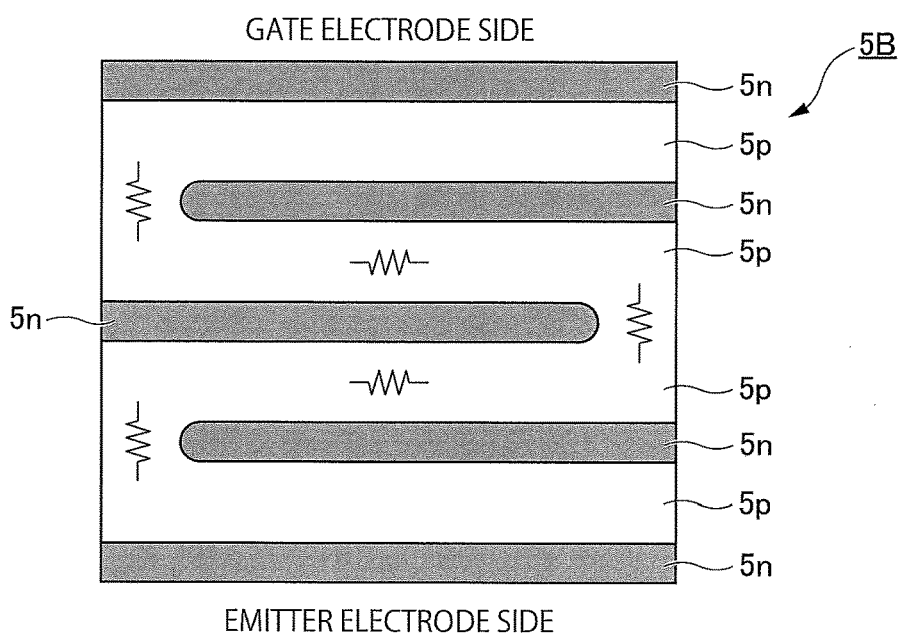
FIG. 8 is a plan view of a Zener diode 5B of a second example of the semiconductor device according to the third embodiment.

Furthermore, as shown in FIG. 8, the distal end of the n-type semiconductor layer 5n interposed between the p-type semiconductor layers 5p may be rounded to have an arc shape in a plan view. Thus, concentration of the current at the distal end of the n-type semiconductor layer 5n can be mitigated.

Figure 9:
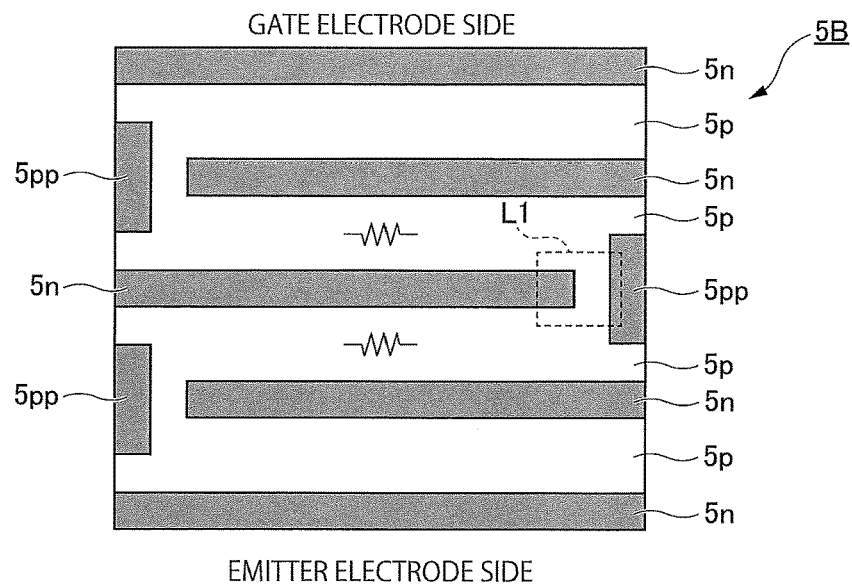
FIG. 9 is a plan view of a Zener diode 5B of a third example of the semiconductor device according to the third embodiment.
Figure 10:
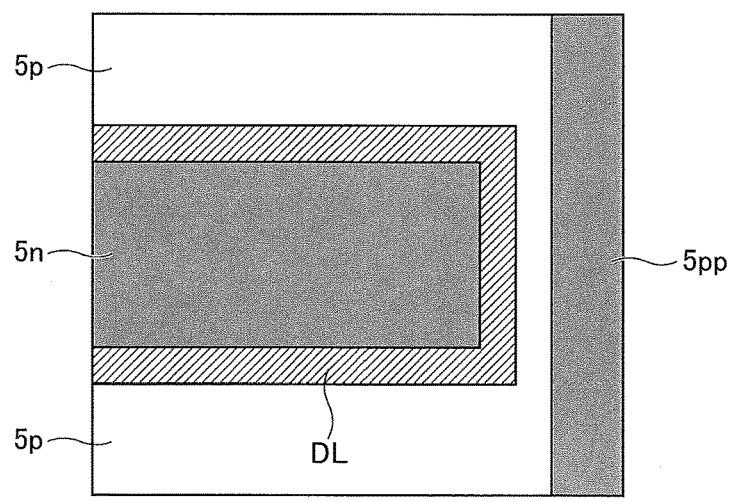
FIG. 10 is an enlarged plan view of a region L1 of FIG. 9.

Furthermore, as shown in FIG. 9, in the connecting region of the adjacent p-type semiconductor layers 5p, a p-type semiconductor layer 5pp having a lower resistance than the p-type semiconductor layers 5p have may be provided. The p-type semiconductor layer 5pp has a higher p-type impurity concentration than the p-type semiconductor layer 5p has. Thus, the current can be suppressed that flows adjacent to the distal end of the n-type semiconductor layer 5n interposed between the p-type semiconductor layers 5p. Note that in this case, as shown in FIG. 10, the low-resistance p-type semiconductor layer 5pp is provided outside of a depletion layer DL formed at the p-n junction between the n-type semiconductor layer 5n and p-type semiconductor layer 5p that constitute the Zener diode 5B. That is, preferably, the p-type semiconductor layer 5pp is provided so as not to reach the depletion layer DL in order not to degrade the characteristics of the Zener diode.

Figure 11:
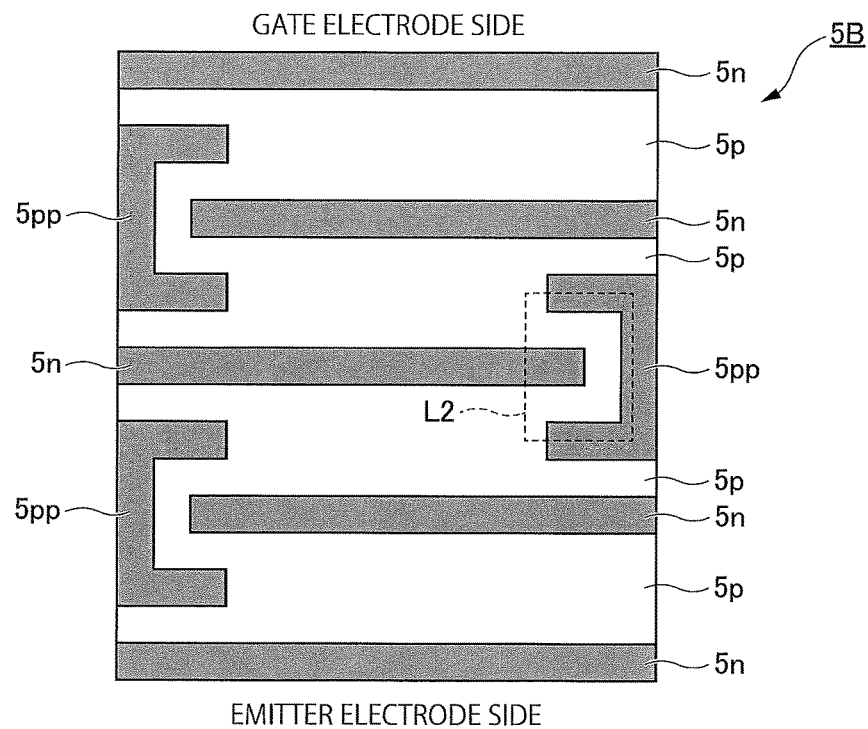
FIG. 11 is a plan view of a Zener diode 5B of a fourth example of the semiconductor device according to the third embodiment.

Furthermore, as shown in FIG. 11, the low-resistance p-type semiconductor layer 5pp may be formed so as to surround the distal end of the n-type semiconductor layer 5n. Thus, concentration of the current at the distal end of the n-type semiconductor layer 5n can be further suppressed. Note that in this case, as shown in FIG. 11, preferably, the inner boundary form of the p-type semiconductor layer 5pp is configured in conformity with the form of the distal end of the n-type semiconductor layer 5n so that the distance between the p-type semiconductor layer 5pp and the n-type semiconductor layer 5n can be substantially constant. Thus, concentration of the current at the distal end of the n-type semiconductor layer 5n can be further effectively suppressed.

Figure 12:
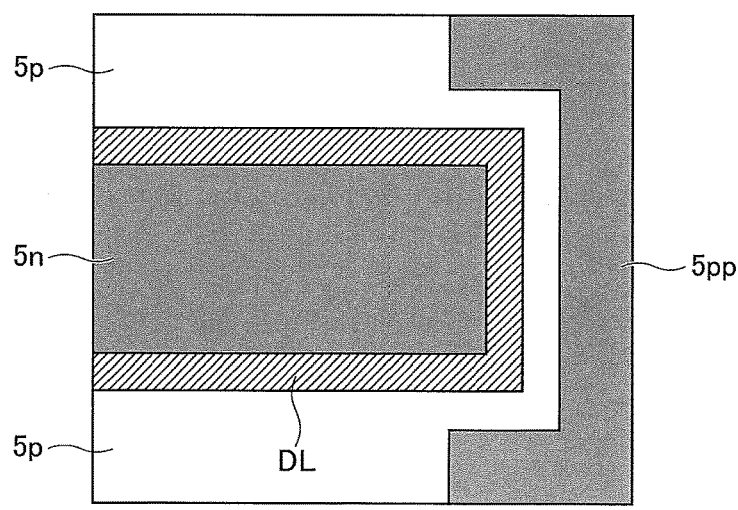
FIG. 12 is an enlarged plan view of a region L2 of FIG. 11.

Preferably, as shown in FIG. 12, the low-resistance p-type semiconductor layer 5pp is provided outside of a depletion layer DL formed at the p-n junction between the n-type semiconductor layer 5n and p-type semiconductor layer 5p that constitute the Zener diode 5B. That is, preferably, the p-type semiconductor layer 5pp is provided so as not to reach the depletion layer DL in order not to degrade the characteristics of the Zener diode.

Besides the above example, the following example can be considered as the third embodiment.

Figure 13:
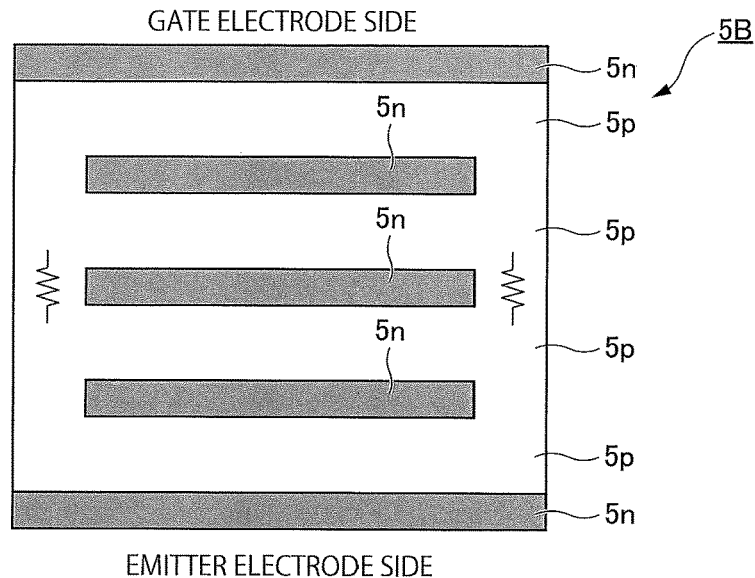
FIG. 13 is a plan view of a Zener diode 5B of a fifth example of the semiconductor device according to the third embodiment.

For example, as shown in FIG. 13, at the opposite ends of the Zener diode 5B in the width direction, the p-type semiconductor layers 5p adjacent to each other in the length direction of the Zener diodes 5B may be connected to each other. In other words, the n-type semiconductor layer 5n may be provided so as to be surrounded by the p-type semiconductor layers 5p. Thus, resistors can be provided at the opposite ends of the Zener diode, thereby allowing the resistance area of the integrated resistor R to be increased.

Figure 14:
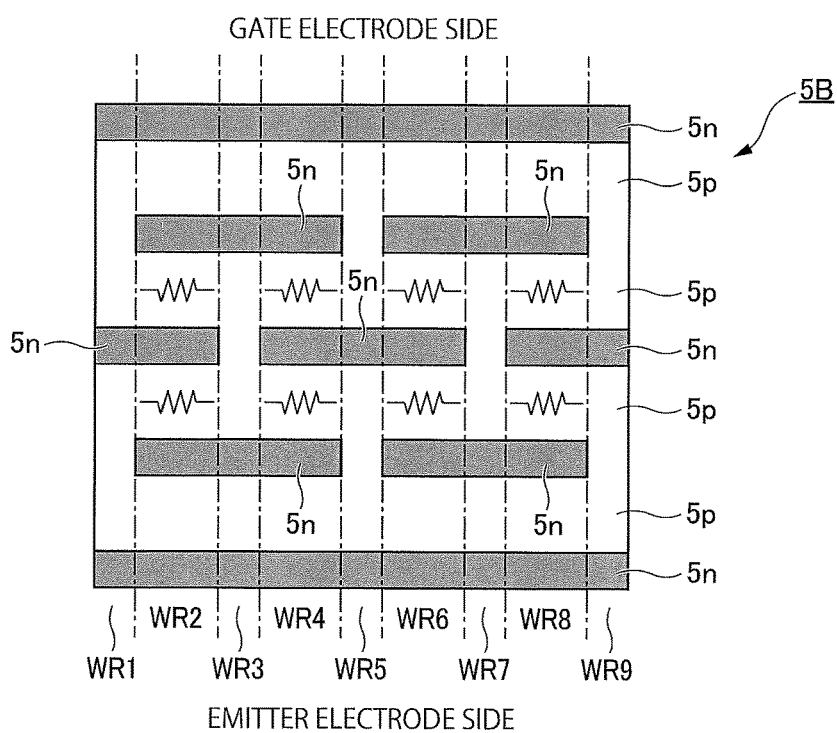
FIG. 14 is a plan view of a Zener diode 5B of a sixth example of the semiconductor device according to the third embodiment.

Further note that, in the Zener diode 5B, the multiple Zener diode elements included therein may be arranged in a divided manner. For example, the number of the n-type semiconductor layers 5n may be different in view of the Zener diode 5B in its length direction. That is, as shown in FIG. 14, in view of the width direction of the Zener diode 5B, the number of n-type semiconductor layers 5n included in the width-direction regions WR1, WR5 and WR9 is three, the number of n-type semiconductor layers 5n included in the width-direction regions WR3 and WR7 is four, and the number of n-type semiconductor layers 5n included in the width-direction regions WR2, WR4, WR6 and WR8 is five. Such arrangement of the Zener diode elements in the distributed manner in the width direction of the Zener diode 5B can suppress current concentration.

Figure 15:
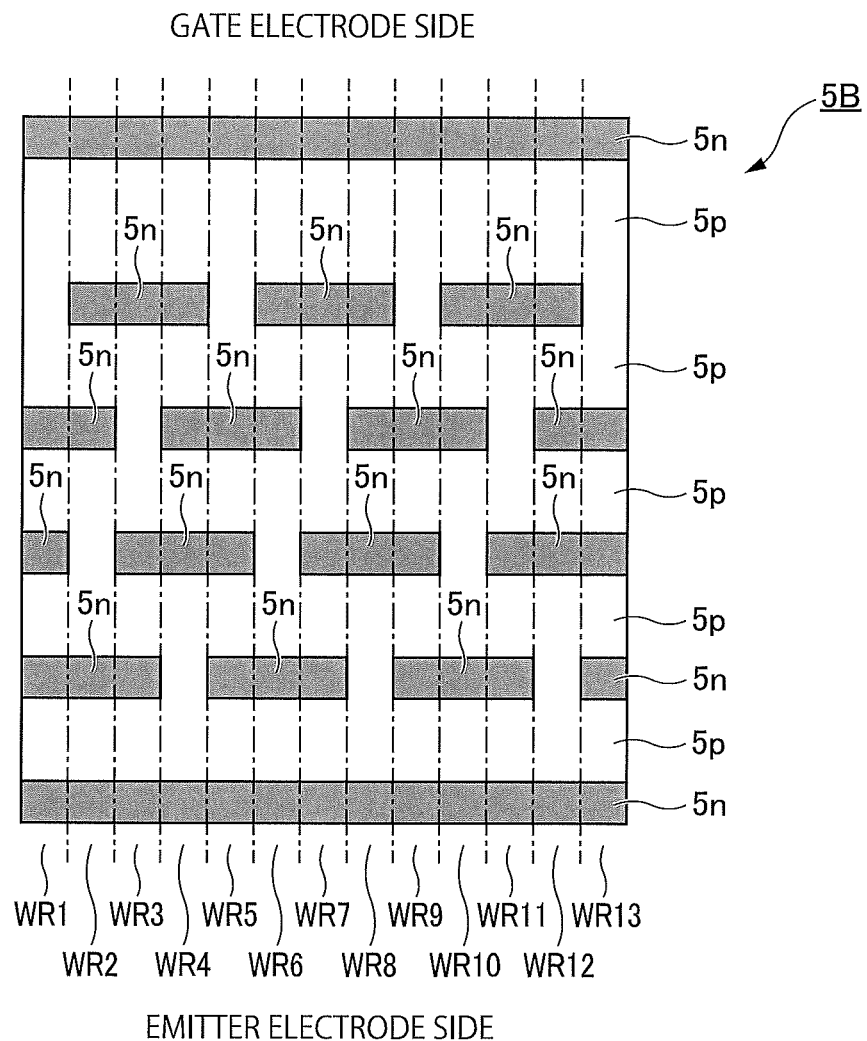
FIG. 15 is a plan view of a Zener diode 5B of a seventh example of the semiconductor device according to the third embodiment.

Alternatively, in view of the Zener diode 5B in its length direction, the number of n-type semiconductor layers 5n may be the same as that in the width direction of the Zener diode 5B. For example, as shown in FIG. 15, in view of the width direction of the Zener diode 5B, a predetermined number (five in this example) of n-type semiconductor layers 5n may be included in each of the width-direction regions WR1 to WR13. Such arrangement of the Zener diode elements in the distributed manner in the width direction allows the current to flow in a distributed manner in the width direction, which can suppress current concentration.

As described above, in the third embodiment, the integrated resistor R connected in parallel to the Zener diode 5B is formed in the distributed manner owing to the planar structure of the Zener diode 5B. Thus, the leak current between the gate and emitter is increased, and the increase in gate voltage is suppressed. Consequently, according to the third embodiment, the semiconductor switch SW can be prevented from being erroneously turned on in the reverse bias application state.

Furthermore, according to the third embodiment, the integrated resistor R is integrally formed in the Zener diode 5B. Consequently, the resistance arrangement area can be reduced in comparison with the case where the resistor is formed, independently from the Zener diode 5B, in the semiconductor chip in which the semiconductor device 1A is formed (i.e., a pattern resistor is formed). As a result, the semiconductor device can be reduced in size, or the area of the active region A of the semiconductor switch SW can be increased.

Fourth Embodiment

Figure 16:
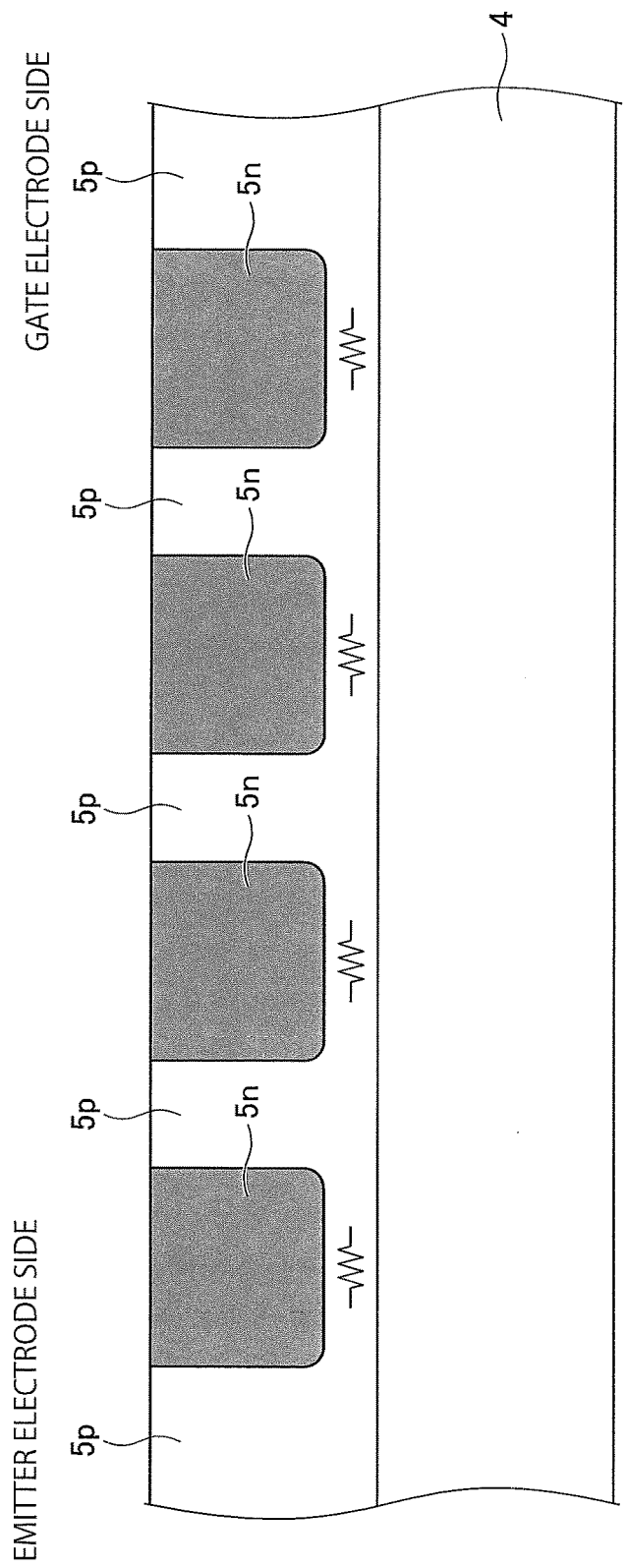
FIG. 16 is a sectional view of a Zener diode 5B of a first example of a semiconductor device according to a fourth embodiment.
Figure 17:
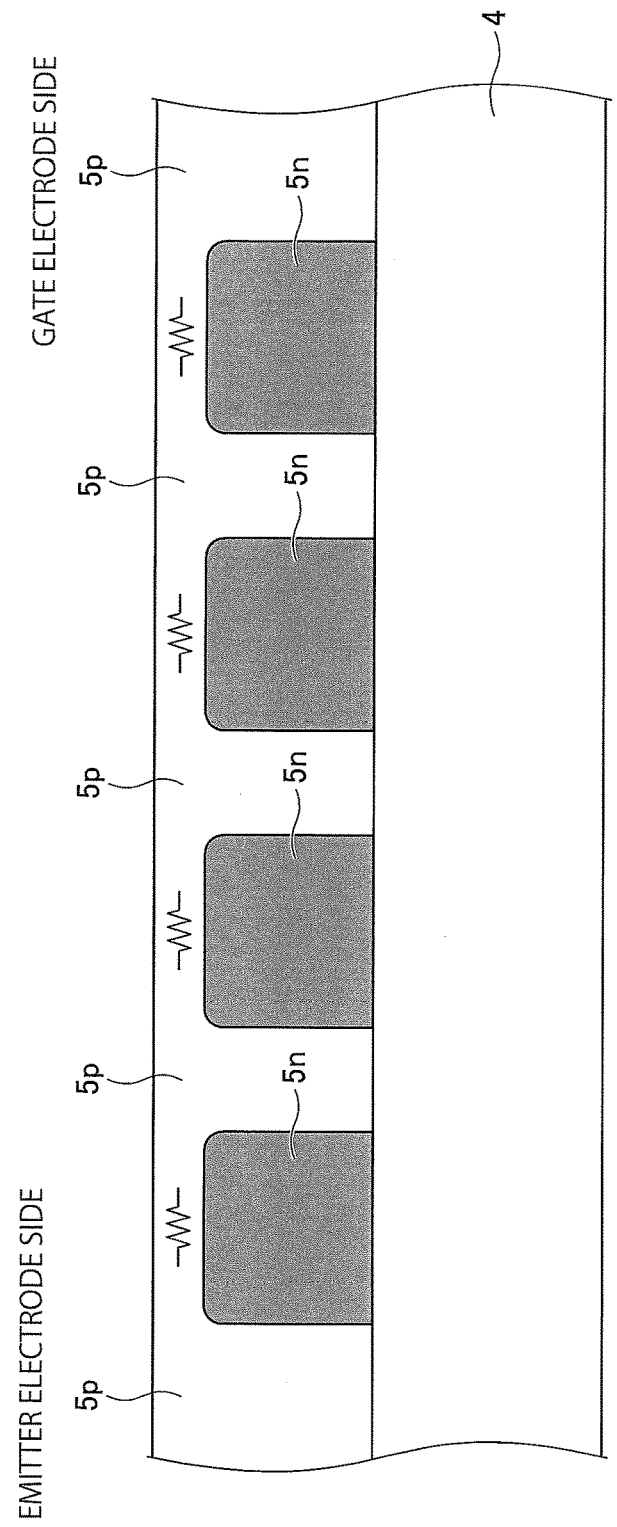
FIG. 17 is a sectional view of a Zener diode 5B of a second example of the semiconductor device according to the fourth embodiment.
Figure 18:
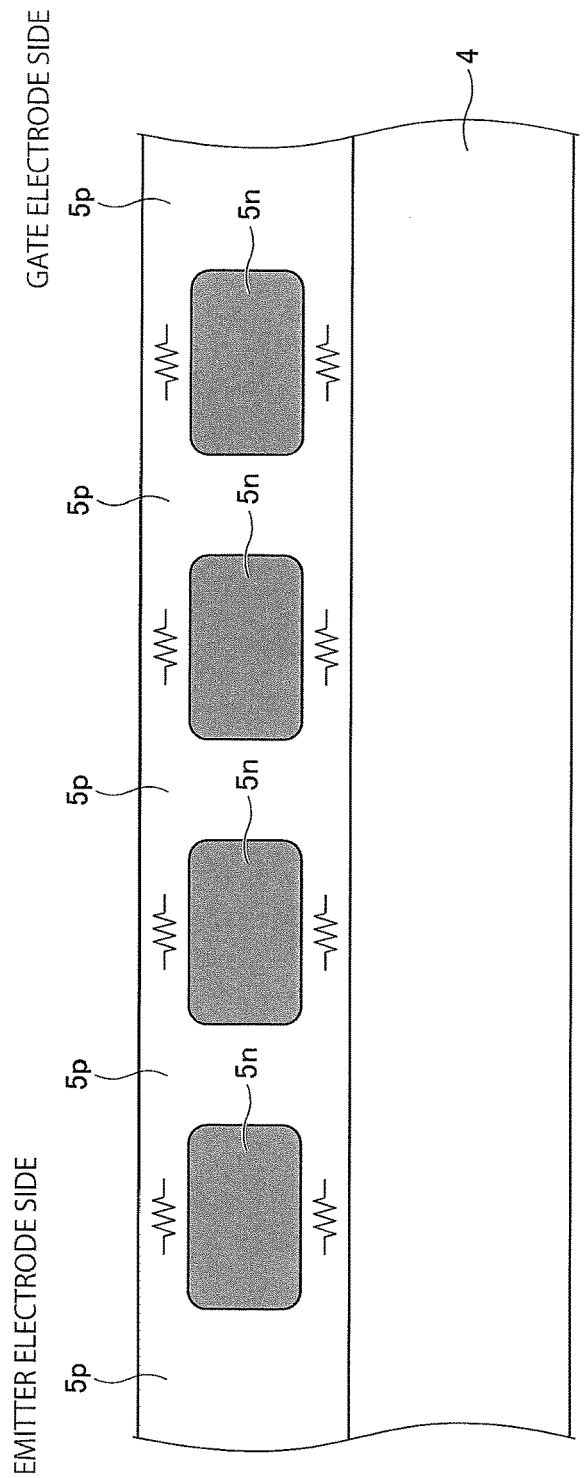
FIG. 18 is a sectional view of a Zener diode 5B of a third example of the semiconductor device according to the fourth embodiment.

Next, referring to FIGS. 16 to 18, a semiconductor device according to a fourth embodiment of the present invention is described. According to the fourth embodiment, as with the third embodiment, an integrated resistor connected in parallel to the Zener diode 5B is provided, thereby increasing the leak current between the gate and emitter and suppressing increase in gate voltage. Note that the embodiment is different from the third embodiment in that the integrated resistor is formed using the sectional structure of the Zener diode 5B. The fourth embodiment is hereinafter described mainly on differences from the third embodiment.

As with the semiconductor device 1A of the third embodiment, the semiconductor device according to the fourth embodiment includes a semiconductor switch SW, a Zener diode 5A, a Zener diode 5B, and an integrated resistor R connected in parallel to the Zener diode 5B.

In the fourth embodiment, the n-type semiconductor layers 5n included in the Zener diode 5B are configured as semiconductor layers into which n-type impurities have been implanted, but are not formed over the entire thicknesses of the semiconductor layers. A region where the n-type semiconductor layer 5n is not formed in view of the thickness direction of the semiconductor layer is an upper layer region or a lower layer region of the semiconductor layer. Note that the n-type semiconductor layer 5n may be formed in neither the upper layer region nor the lower layer region. Specific examples in the respective cases are hereinafter described with reference to the drawings.

In the example of FIG. 16, the n-type semiconductor layers 5n are formed from the upper surface of the Zener diode 5B to the middle thereof, and the p-type semiconductor layers 5p reside in the lower layer region of the semiconductor layer. The p-type semiconductor layers 5p constitute the integrated resistor R. The regions where the n-type semiconductor layers 5n are formed are adjusted by the acceleration voltage of the n-type impurities during selective ion injection and adjustment of the annealing temperature, for example.

In the example of FIG. 17, the n-type semiconductor layers 5n are formed from the middle of the semiconductor layer of the Zener diode 5B to the lower surface (the boundary between the semiconductor layer and the insulating film 4), and the p-type semiconductor layers 5p reside in the upper layer region of the semiconductor layer. The p-type semiconductor layers 5p constitute the integrated resistor R.

In the example of FIG. 18, the n-type semiconductor layers 5n are formed at the center portions of the semiconductor layer of the Zener diode 5B in the thickness direction, and the p-type semiconductor layers 5p reside in both the upper layer region and the lower layer region of the semiconductor layer. The p-type semiconductor layers 5p constitute the integrated resistor R.

As described above, according to the fourth embodiment, in view of the Zener diode 5B in its thickness direction, in the upper layer region and/or the lower layer region of the semiconductor layer, the p-type resistor layers that connect the p-type semiconductor layers 5p which are adjacent to each other and between which the n-type semiconductor layers 5n are interposed constitute the integrated resistor R. That is, the integrated resistor R connected in parallel to the Zener diode 5B is formed in the distributed manner owing to the sectional structure of the Zener diode 5B. Thus, the leak current between the gate and emitter is increased, and the increase in gate voltage is suppressed. Consequently, according to the fourth embodiment, the semiconductor switch SW can be prevented from being erroneously turned on in the reverse bias application state.

Furthermore, according to the fourth embodiment, the integrated resistor R is integrally formed in the Zener diode 5B. Consequently, the resistance arrangement area can be reduced in comparison with the case where the resistor is formed in the semiconductor chip independently from the Zener diode 5B (i.e., a pattern resistor is formed). As a result, the semiconductor device can be reduced in size, or the area of the active region A of the semiconductor switch SW can be increased.

(Ignition Device)

Figure 19:
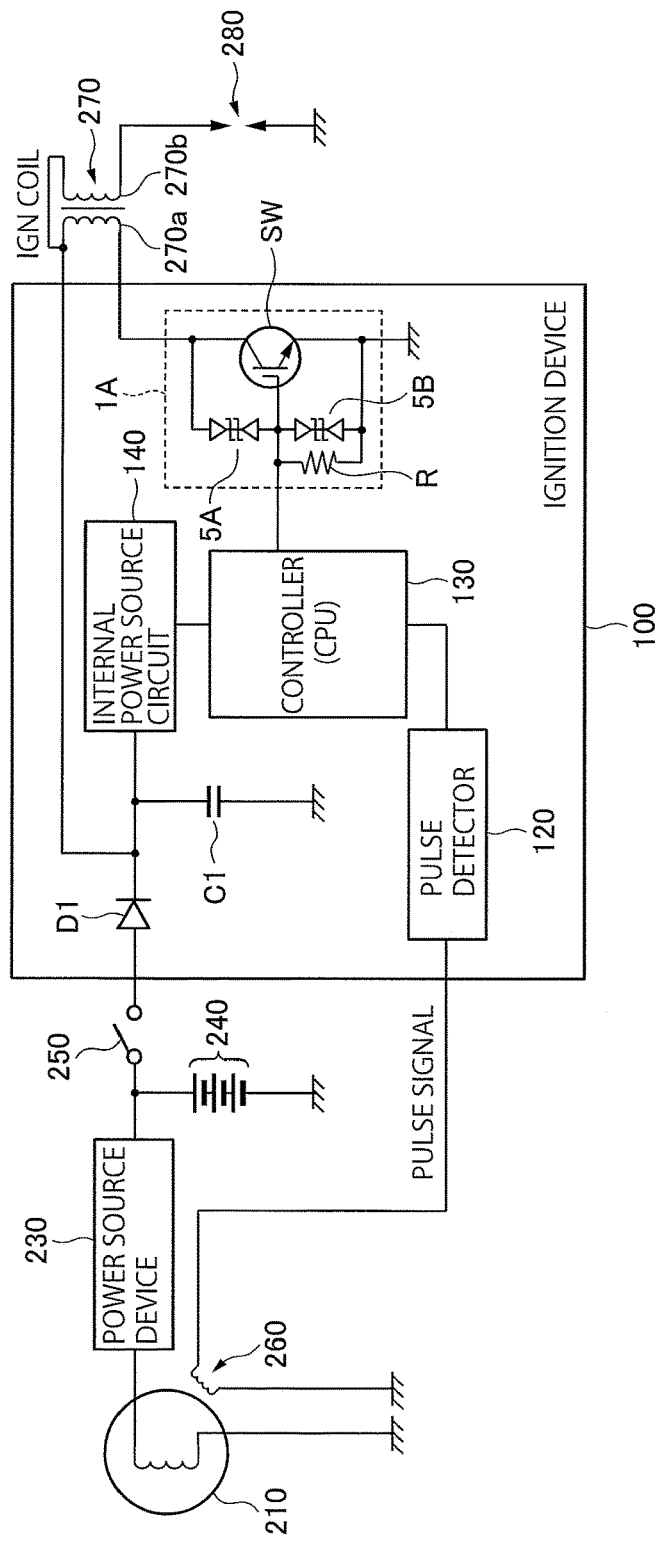
FIG. 19 is a schematic configuration diagram of an ignition device 100 according to an embodiment.

Next, referring to FIG. 19, an ignition device that includes the semiconductor device according to the present invention is described. The ignition devices are applied to internal-combustion engines of vehicles, such as motorcycles and automobiles, and ignite mixtures for the internal-combustion engines by applying high voltages to spark plugs to discharge.

An internal-combustion engine driving system shown in FIG. 19 includes an ignition device 100, an alternate-current generator (ACG) 210, a power source device 230, a battery 240, a switch 250, a pickup coil 260, an ignition coil 270, and an ignition plug 280. The ignition device 100 is what is called a full-transistor type ignition device.

The alternate-current generator 210 is a generator that is driven by an internal-combustion engine to generate electricity. More specifically, the alternate-current generator 210 is rotationally driven in synchronization with the rotation of the internal-combustion engine to generate electricity, and outputs an alternate-current voltage. The rotor of the alternate-current generator 210 is provided with a projecting reluctor (not shown). Rotation of the rotor of the alternate-current generator 210 allows the reluctor to pass through the proximity of the pickup coil 260, thereby generating a pulse voltage at the pickup coil 260.

The alternate-current voltage supplied by the alternate-current generator 210 is supplied to the power source device 230. The power source device 230 rectifies the alternate-current voltage supplied by the alternate-current generator 210, and adjusts and outputs the voltage. The battery 240 is charged with the direct-current voltage output from the power source device 230. The voltage of the battery 240 is supplied through the switch 250 to the ignition device 100.

The ignition coil 270 includes a primary coil 270a and a secondary coil 270b. One end of the primary coil 270a and one end of the secondary coil 270b are each connected to the cathode of a diode D1 of the ignition device 100. The other end of the primary coil 270a is connected to the collector electrode of the semiconductor device 1 (semiconductor switch SW) of the semiconductor device 1 of the ignition device 100. The other end of the secondary coil 270b is connected to the 280.

The ignition plug 280 includes a pair of opposite electrodes, and is provided between the other end of the secondary coil 270b and the ground. The ignition plug 280 generates spark discharge in the gap between electrodes by the voltage generated in the secondary coil 270b, and ignites the mixture in a fuel chamber of an internal-combustion engine.

Next, the configuration of the ignition device 100 is described in detail.

As shown in FIG. 19, the ignition device 100 includes the diode D1, a capacitor C1, the semiconductor device 1A (semiconductor switch SW), a pulse detector 120, a controller 130, and an internal power source circuit 140. Note that the ignition device 100 may include the semiconductor device 1 instead of the semiconductor device 1A.

The diode D1 is provided between the switch 250 and the internal power source circuit 140. In a state where the switch 250 is on, the output voltage of the battery 240 is supplied to the anode of the diode D1 through the switch 250. The capacitor C1 is connected between the cathode of the diode D1 and the ground. The diode D1 and the capacitor C1 function as a smoothing circuit for the input voltage to the ignition device 100.

In the semiconductor switch SW of the semiconductor device 1, the collector electrode is connected to the primary coil 270a of the ignition coil 270, and the emitter electrode is grounded, and the gate electrode is connected to the controller 130. The semiconductor switch SW is controlled to be turned on or off according to a control signal output from the controller 130.

The pulse detector 120 is connected to the pickup coil 260, and receives pulses output from the pickup coil 260. The controller 130 turns on or off the semiconductor switch SW on the basis of the pulses detected by the pulse detector 120, thereby performing ignition control for the internal-combustion engine. The controller 130 may be a microcomputer, for example. The internal power source circuit 140 adjusts the input direct-current voltage to an operation voltage of the controller 130, and outputs the voltage.

As described above, this embodiment can provide the ignition device 100 that can prevent the semiconductor switch SW from erroneously operating, without attaching an external resistor as a resistor between the gate and emitter to the semiconductor switch SW of the semiconductor device 1 or without forming a pattern resistor in the semiconductor chip in which the semiconductor switch SW is formed.

Based on the above description, those skilled in the art may arrive at additional advantageous effects of the present invention or various modifications. However, the modes of the present invention are not limited to the individual embodiments described above. Configuration elements in different embodiments may be appropriately combined. Various types of addition, modification and partial deletion can be made within a range without departing from the conceptual thought and spirit of the present invention that can be derived from the content specified in claims and equivalents thereof.

REFERENCE SIGNS LIST 1, 1A Semiconductor device
2 Semiconductor substrate
4 Insulating film
5A, 5B Zener diode
5n N-type semiconductor layer
5nh Current concentration mitigator
5p P-type semiconductor layer
5pp (Low resistance) p-type semiconductor layer
6, 7, 8, 9 Conductor portion
100 Ignition device
A Active region
B Voltage supporting region
C Collector region
DL Depletion layer
E Emitter electrode
G Gate electrode
L1, L2 Region
R Integrated resistor
SW Semiconductor switch
W1, W2 Width
WR1 to WR13 Width-direction region

The invention claimed is:

1. A semiconductor device, comprising:
a semiconductor switch that includes a first main electrode connected to a high potential, a second main electrode connected to a low potential, and a control electrode;
a first Zener diode configured to include one end electrically connected to the first main electrode, another end electrically connected to the control electrode, and n-type semiconductor layers and p-type semiconductor layers alternately arranged adjacent to each other; and
a second Zener diode configured to include one end electrically connected to the control electrode, and another end electrically connected to the second main electrode, and n-type semiconductor layers and p-type semiconductor layers alternately arranged adjacent to each other, wherein
junction areas between the n-type semiconductor layers and the p-type semiconductor layers included in the first Zener diode are smaller than junction areas between the n-type semiconductor layers and the p-type semiconductor layers included in the second Zener diode.

2. The semiconductor device according to claim 1, wherein widths of the n-type semiconductor layers and the p-type semiconductor layers included in the first Zener diode are smaller than widths of the n-type semiconductor layers and the p-type semiconductor layers included in the second Zener diode.

3. The semiconductor device according to claim 1, wherein thicknesses of the n-type semiconductor layers and the p-type semiconductor layers included in the first Zener diode are smaller than thicknesses of the n-type semiconductor layers and the p-type semiconductor layers included in the second Zener diode.

4. A semiconductor device, comprising:
a semiconductor switch that includes a first main electrode connected to a high potential, a second main electrode connected to a low potential, and a control electrode;

a first Zener diode configured to include one end electrically connected to the first main electrode, another end electrically connected to the control electrode, and n-type semiconductor layers and p-type semiconductor layers alternately arranged adjacent to each other; and a second Zener diode configured to include one end electrically connected to the control electrode, and another end electrically connected to the second main electrode, and n-type semiconductor layers and p-type semiconductor layers alternately arranged adjacent to each other, wherein the n-type semiconductor layers each interposed between the p-type semiconductor layers among the n-type semiconductor layers included in the second Zener diode are not formed over an entire width of the second Zener diode, and the p-type semiconductor layers adjacent in a length direction of the second Zener diode are connected to each other.

5. The semiconductor device according to claim 4, wherein the p-type semiconductor layers included in the second Zener diode are meanderingly formed in a plan view.

6. The semiconductor device according to claim 5, wherein the n-type semiconductor layers each interposed between the p-type semiconductor layers have distal ends rounded to have arc shapes in a plan view.

7. The semiconductor device according to claim 5, wherein a connecting region of the adjacent p-type semiconductor layers is provided with a p-type semiconductor layer having a lower resistance than the p-type semiconductor layer has.

8. The semiconductor device according to claim 7, wherein the p-type semiconductor layer having the lower resistance is formed so as to surround a distal end of the n-type semiconductor layer.

9. The semiconductor device according to claim 7, wherein the p-type semiconductor layer having the lower resistance is provided outside of a depletion layer formed at a p-n junction between the n-type semiconductor layer and the p-type semiconductor layer included in the second Zener diode.

10. The semiconductor device according to claim 4, wherein at opposite ends of the second Zener diode in a width direction, the p-type semiconductor layers adjacent in the length direction of the second Zener diode are connected to each other.

11. The semiconductor device according to claim 4, wherein in view of the second Zener diode in the length direction thereof, the numbers of n-type semiconductor layers are different from each other with respect to a width direction of the second Zener diode.

12. The semiconductor device according to claim 4, wherein in view of the second Zener diode in the length direction thereof, the numbers of n-type semiconductor layers are identical to each other with respect to a width direction of the second Zener diode.

13. A semiconductor device according to claim 5, comprising:

a semiconductor switch that includes a first main electrode connected to a high potential, a second main electrode connected to a low potential, and a control electrode;

a first Zener diode configured to include one end electrically connected to the first main electrode, another end electrically connected to the control electrode, and n-type semiconductor layers and p-type semiconductor layers alternately arranged adjacent to each other; and a second Zener diode configured to include one end electrically connected to the control electrode, and another end electrically connected to the second main electrode, and n-type semiconductor layers and p-type semiconductor layers alternately arranged adjacent to each other, wherein the n-type semiconductor layers included in the second Zener diode are configured as semiconductor layers into which n-type impurities have been implanted, but are not formed over entire thicknesses of the semiconductor layers.

14. A semiconductor device, comprising:

a semiconductor switch that includes a first main electrode connected to a high potential, a second main electrode connected to a low potential, and a control electrode;

a first Zener diode configured to include one end electrically connected to the first main electrode, another end electrically connected to the control electrode, and n-type semiconductor layers and p-type semiconductor layers alternately arranged adjacent to each other; and a second Zener diode configured to include one end electrically connected to the control electrode, and another end electrically connected to the second main electrode, and n-type semiconductor layers and p-type semiconductor layers alternately arranged adjacent to each other, wherein a p-type impurity concentration of the p-type semiconductor layers included in the first Zener diode is lower than an n-type impurity concentration of the n-type semiconductor layers included in the first Zener diode, and a p-type impurity concentration of the p-type semiconductor layers included in the second Zener diode is lower than an n-type impurity concentration of the n-type semiconductor layers included in the second Zener diode, and a current amplification rate of a first npn-type bipolar transistor that includes consecutive n-type semiconductor layers, p-type semiconductor layers and n-type semiconductor layers included in the first Zener diode is lower than a current amplification rate of a second npn-type bipolar transistor that includes consecutive n-type semiconductor layers, p-type semiconductor layers and n-type semiconductor layers included in the second Zener diode.

15. The semiconductor device according to claim 14, wherein the p-type semiconductor layer of the first npn-type bipolar transistor is longer than the p-type semiconductor layer of the second npn-type bipolar transistor.

16. The semiconductor device according to claim 14, wherein the impurity concentration of the p-type semiconductor layer of the first npn-type bipolar transistor is higher than the impurity concentration of the p-type semiconductor layer of the second npn-type bipolar transistor.

* * * * *